US011276627B2

(12) United States Patent
Kawashima et al.

(10) Patent No.: US 11,276,627 B2
(45) Date of Patent: Mar. 15, 2022

(54) SEMICONDUCTOR DEVICE

(71) Applicant: DENSO CORPORATION, Kariya (JP)

(72) Inventors: Takanori Kawashima, Anjo (JP);
Takuya Kadoguchi, Toyota (JP);
Tetsuya Akino, Aichi (JP); Yuya Osamura, Toyoake (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 16/844,531

(22) Filed: Apr. 9, 2020

(65) Prior Publication Data

US 2020/0365490 A1    Nov. 19, 2020

(30) Foreign Application Priority Data

May 15, 2019    (JP) .............. JP2019-092448

(51) Int. Cl.
*H01L 23/492* (2006.01)
*H01L 25/065* (2006.01)
*H01L 23/31* (2006.01)

(52) U.S. Cl.
CPC ........ *H01L 23/492* (2013.01); *H01L 23/3142* (2013.01); *H01L 25/0657* (2013.01)

(58) Field of Classification Search
CPC .............. H01L 23/492; H01L 25/0657; H01L 23/3142; H01L 21/565; H01L 2924/13091; H01L 2924/13055; H01L 2924/181; H01L 21/4871
See application file for complete search history.

(56) References Cited

U.S. PATENT DOCUMENTS

2012/0228757 A1    9/2012  Kitami et al.
2019/0393196 A1*  12/2019  Jong ................... H01L 23/3735

FOREIGN PATENT DOCUMENTS

JP    2016-36047 A    3/2016
WO    2011/064841 A1   6/2011

* cited by examiner

*Primary Examiner* — Jasmine J Clark
(74) *Attorney, Agent, or Firm* — Sughrue Mion, PLLC

(57) ABSTRACT

A semiconductor device may include: an upper conductive plate, a middle conductive plate, and a lower conductive plate which are stacked on each other; a first semiconductor chip located between the upper and middle conductive plates and electrically connected to both the upper and middle; a second semiconductor chip located between the middle and lower conductive plates and electrically connected to both the middle and lower conductive plates; and an encapsulant encapsulating the first and second semiconductor chips and integrally holding the upper, middle and lower conductive plates. The middle conductive plate may include a main portion joined to the first and second semiconductor chips within the encapsulant and an exposed portion exposed outside on a surface of the encapsulant. A thickness of the exposed portion may be equal to or greater than a thickness of the main portion.

6 Claims, 6 Drawing Sheets

SEMICONDUCTOR DEVICE

CROSS-REFERENCE TO RELATED APPLICATION(S)

This application claims priority to Japanese Patent Application No. 2019-092448, filed on May 15, 2019, the entire contents of which are incorporated herein by reference.

TECHNICAL FIELD

The art disclosed herein relates to a semiconductor device.

BACKGROUND

Japanese Patent Application Publication 2016-36047 describes a semiconductor device. This semiconductor device includes an upper conductive plate, a middle conductive plate, and a lower conductive plate stacked on each other, a first semiconductor chip located between the upper conductive plate and the middle conductive plate, a second semiconductor chip located between the middle conductive plate and the lower conductive plate, and an encapsulant encapsulating the first and second semiconductor chips and integrally holding the upper, middle, and lower conductive plates.

SUMMARY

In the aforementioned semiconductor device, each of the first and second semiconductor chips generates heat by being electrically conducted. When the first and second semiconductor chips generate heat, temperatures of the three conductive plates adjacent thereto also rise, and thermal expansion occurs in the respective conductive plates. Especially, the middle conductive plate located between the first and second semiconductor chips tends to become hotter than the upper and lower conductive plates and undergo relatively larger thermal expansion. Such uneven thermal expansion could locally aggravate distortion within the semiconductor device, which may result in deteriorated durability of the semiconductor device.

The description herein provides an art configured to suppress a temperature rise in a middle conductive plate in a semiconductor device in which three or more conductive plates are stacked.

A semiconductor device disclosed herein may include: an upper conductive plate, a middle conductive plate, and a lower conductive plate which are stacked on each other; a first semiconductor chip located between the upper conductive plate and the middle conductive plate and electrically connected to both the upper conductive plate and the middle conductive plate; a second semiconductor chip located between the middle conductive plate and the lower conductive plate and electrically connected to both the middle conductive plate and the lower conductive plate; and an encapsulant encapsulating the first semiconductor chip and the second semiconductor chip and integrally holding the upper conductive plate, the middle conductive plate, and the lower conductive plate. The middle conductive plate may include a main portion joined to the first semiconductor chip and the second semiconductor chip within the encapsulant and an exposed portion exposed outside on a surface of the encapsulant. A thickness of the exposed portion of the middle conductive plate may be equal to or greater than a thickness of the main portion of the middle conductive plate.

In the aforementioned semiconductor device, heat from the middle conductive plate can easily be dissipated outside due to the middle conductive plate being exposed outside on the surface of the encapsulant. Due to this, a temperature rise in the middle conductive plate can effectively be suppressed.

DETAILED DESCRIPTION

Figure 1:
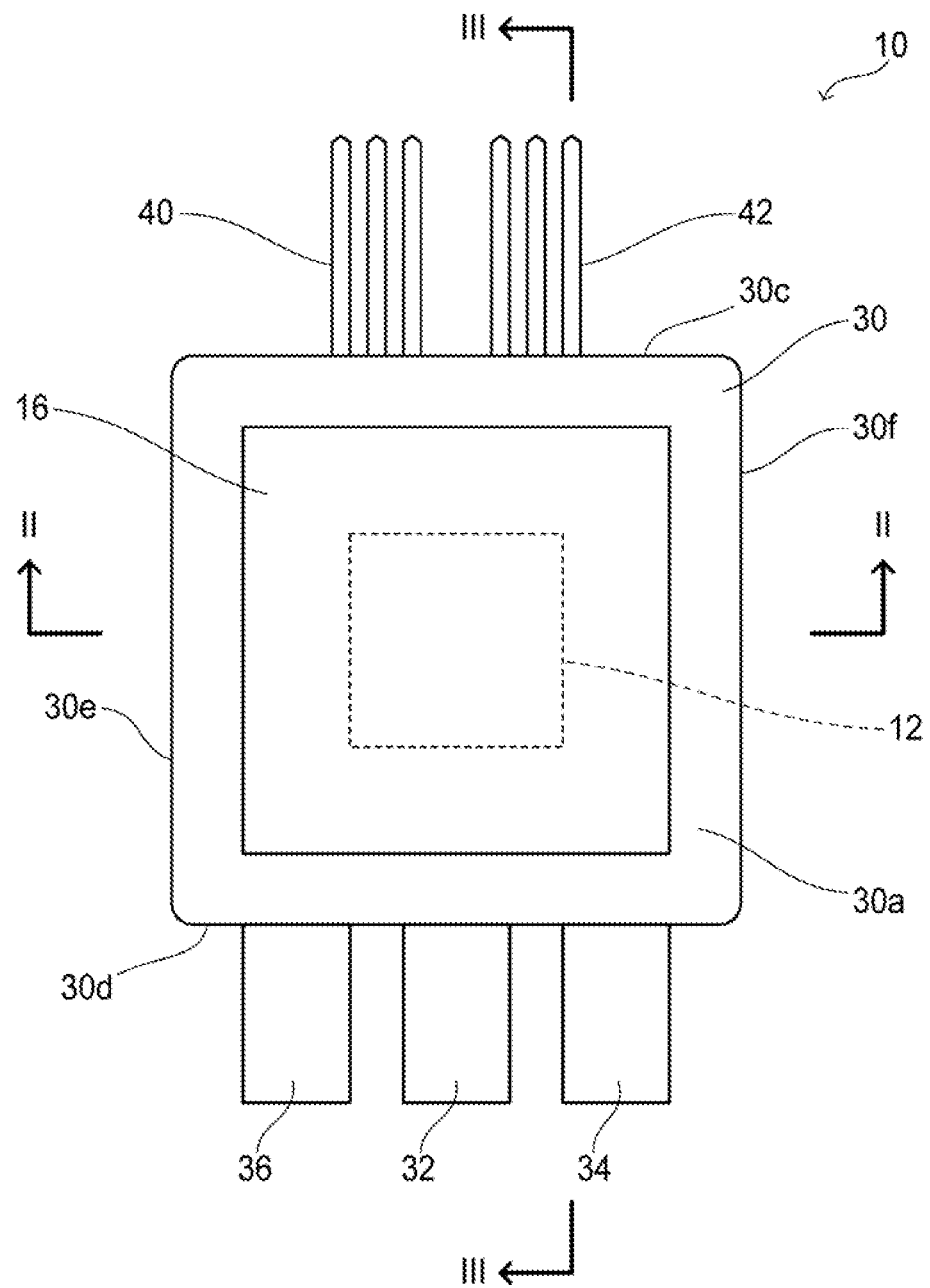
FIG. 1 shows an outer appearance of a semiconductor device 10 of an embodiment.

In an aspect of the art disclosed herein, a thickness of an exposed portion of a middle conductive plate may be greater than a thickness of a main portion of the middle conductive plate. According to such a configuration, heat from the middle conductive plate is dissipated more efficiently to outside.

In an aspect of the art disclosed herein, an encapsulant may comprise an upper surface and a lower surface located at an opposite side of the upper surface. In this case, an upper conductive plate may be exposed outside on the upper surface of the encapsulant, and a lower conductive plate may be exposed outside on the lower surface of the encapsulant. According to such a configuration, heat from a first semiconductor chip and from a second semiconductor chip is dissipated to outside more efficiently through the upper conductive plate and the lower conductive plate.

In the aforementioned aspect of the art disclosed herein, the encapsulant may further comprise a side surface extending between the upper surface and the lower surface. In this case, the exposed portion of the middle conductive plate may be exposed outside on the side surface of the encapsulant. According to such a configuration, the middle conductive plate can easily be exposed outside on the surface of the encapsulant.

In addition to or as an alternative of the above, the exposed portion of the middle conductive plate may be exposed outside on at least one of the upper surface and the lower surface of the encapsulant. According to such a configuration, the middle conductive plate may be cooled simultaneously as the upper conductive plate and/or the lower conductive plate by arranging cooler(s) adjacent to a semiconductor device, for example.

Representative, non-limiting examples of the present disclosure will now be described in further detail with reference to the attached drawings. This detailed description is merely intended to teach a person of skill in the art further details for practicing aspects of the present teachings and is not intended to limit the scope of the present disclosure. Furthermore, each of the additional features and teachings disclosed below may be utilized separately or in conjunction with other features and teachings to provide improved semiconductor devices, as well as methods for using and manufacturing the same.

Moreover, combinations of features and steps disclosed in the following detailed description may not be necessary to practice the present disclosure in the broadest sense, and are instead taught merely to particularly describe representative examples of the present disclosure. Furthermore, various features of the above-described and below-described representative examples, as well as the various independent and dependent claims, may be combined in ways that are not specifically and explicitly enumerated in order to provide additional useful embodiments of the present teachings.

All features disclosed in the description and/or the claims are intended to be disclosed separately and independently from each other for the purpose of original written disclosure, as well as for the purpose of restricting the claimed subject matter, independent of the compositions of the features in the embodiments and/or the claims. In addition, all value ranges or indications of groups of entities are intended to disclose every possible intermediate value or intermediate entity for the purpose of original written disclosure, as well as for the purpose of restricting the claimed subject matter.

Embodiments

A semiconductor device 10 of an embodiment will be described with reference to FIGS. 1 to 4. The semiconductor device 10 of the embodiment is employed in a power controller of an electric vehicle, for example, and can constitute a part of a power converter circuit such as a converter and an inverter. The electric vehicle described herein refers broadly to vehicles having a motor configured to drive a wheel, and may for example include an electric vehicle charged by external power, a hybrid vehicle including an engine in addition to a motor, and a fuel cell vehicle using a fuel cell as its power source.

The semiconductor device 10 comprises a plurality of semiconductor chips 12, 14, a plurality of conductive plates 16, 18, 20, and an encapsulant 30. The encapsulant 30 encapsulates the plurality of semiconductor chips 12, 14 and integrally holds the plurality of conductive plates 16, 18, 20. The encapsulant 30 is constituted of an insulative material. Although not particularly limited, the encapsulant 30 in the present embodiment is constituted of a resin material for encapsulation, such as epoxy resin.

The encapsulant 30 has a substantially plate-like shape, and includes an upper surface 30a, a lower surface 30b, a first end surface 30c, a second end surface 30d, a first side surface 30e, and a second side surface 30f. The upper surface 30a and the lower surface 30b are located opposite from each other, and each of the first end surface 30c, the second end surface 30d, the first side surface 30e, and the second side surface 30f extends between the upper surface 30a and the lower surface 30b. Further, the first end surface 30c and the second end surface 30d are located opposite from each other, and the first side surface 30e and the second side surface 30f are located opposite from each other.

The plurality of semiconductor chips 12, 14 includes a first semiconductor chip 12 and a second semiconductor chip 14. The first semiconductor chip 12 and the second semiconductor chip 14 are power semiconductor chips, and have a same structure as each other. The semiconductor chip 12 includes a semiconductor substrate 12a, a first main electrode 12b, a second main electrode 12c, and a plurality of signal electrodes 12d. Similarly, the semiconductor chip 14 includes a semiconductor substrate 14a, a first main electrode 14b, a second main electrode 14c, and a plurality of signal electrodes 14d. Although not particularly limited, each of the semiconductor substrates 12a, 14a may be a silicon substrate, a silicon carbide substrate, or a nitride semiconductor substrate.

Each of the first main electrodes 12b, 14b is located on a front surface of the corresponding semiconductor substrate 12a, 14a, and each of the second main electrodes 12c, 14c is located on a rear surface of the corresponding semiconductor substrate 12a, 14a. The first main electrode 12b and the second main electrode 12c are electrically connected to each other through the semiconductor substrate 12a. Similarly, the first main electrode 14b and the second main electrode 14c are electrically connected to each other through the semiconductor substrate 14a. Although not particularly limited, each of the semiconductor chips 12, 14 is a switching element, and is configured to electrically connect and disconnect the corresponding first main electrode 12b, 14b and the corresponding second main electrode 12c, 14c selectively. Each plurality of signal electrodes 12d, 14d is located on the front surface of the corresponding semiconductor substrate 12a, 14a, similar to each of the first main electrodes 12b, 14b. Each of the signal electrodes 12d, 14d is sufficiently smaller than the corresponding first main electrode 12b, 14b and the corresponding second main electrode 12c, 14c. However, since both the first main electrode 12b and the plurality of signal electrodes 12d are located on the front surface of the semiconductor substrate 12a, an area of the first main electrode 12b is smaller than an area of the second main electrode 12c. Similarly, since both the first main electrode 14b and the plurality of signal electrodes 14d are located on the front surface of the semiconductor substrate 14a, an area of the first main electrode 14b is smaller than an area of the second main electrode 14c. Each of the first main electrodes 12b, 14b, the second main electrodes 12c, 14c, and the signal electrodes 12d, 14d may be constituted of one or more types of metal, such as aluminum, nickel, and gold.

Figure 4:
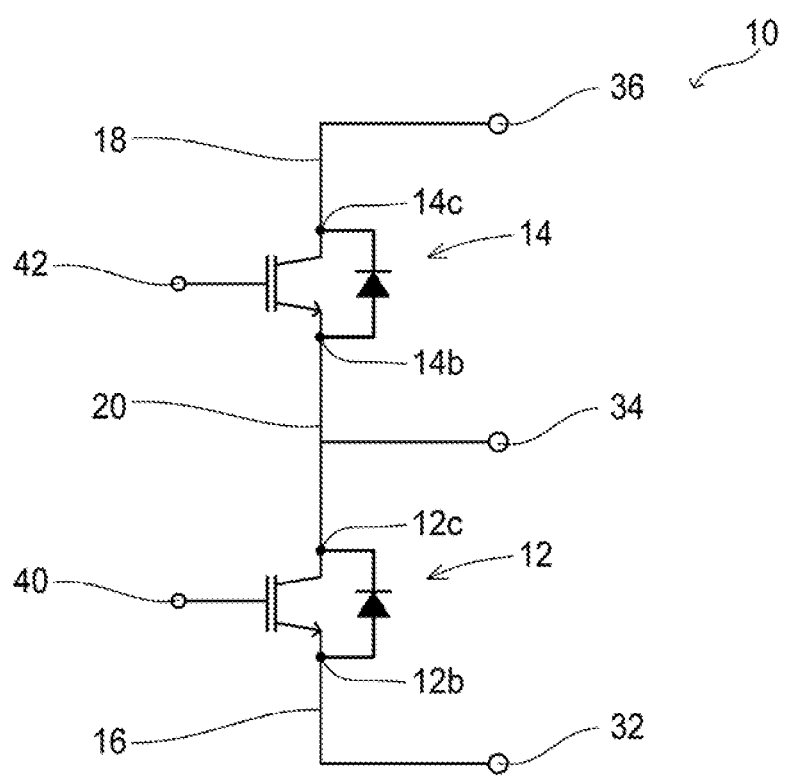
FIG. 4 shows a circuit structure of the semiconductor device 10 of the embodiment.

Although this is merely an example, as shown in FIG. 4, each of the semiconductor chips 12, 14 in the present embodiment is a Reverse Conducting Insulated Gate Bipolar Transistor (RC-IGBT) in which an IGBT and a diode are integrally configured. Each of the first main electrodes 12b, 14b is connected to an emitter of the corresponding IGBT and an anode of the corresponding diode, and each of the second main electrodes 12c, 14c is connected to a collector of the corresponding IGBT and a cathode of the corresponding diode. Further, one of each plurality of signal electrodes 12d, 14d is connected to a gate of the corresponding IGBT. As another embodiment, the first semiconductor chip 12 and/or the second semiconductor chip 14 may be Metal-Oxide-Semiconductor Field-Effect Transistors (MOSFETs). In this case, one or both of the first main electrodes 12b, 14b are connected to source(s) of the corresponding MOSFET(s)

and one or both of the second main electrodes 12c, 14c is connected to drain(s) of the corresponding MOSFET(s). Further, one electrode of one plurality or both pluralities of signal electrodes 12d, 14d is connected to a gate of the corresponding MOSFET.

The plurality of conductive plates 16, 18, 20 includes an upper conductive plate 16, a middle conductive plate 20, and a lower conductive plate 18. Each of the conductive plates 16, 18, 20 is a plate-like member having conductivity at least in part thereof. Three conductive plates 16, 18, 20 are stacked on each other, and the plurality of semiconductor chips 12, 14 are interposed therebetween. That is, the first semiconductor chip 12 is located between the upper conductive plate 16 and the middle conductive plate 20 and is electrically connected to both the upper conductive plate 16 and the middle conductive plate 20. The second semiconductor chip 14 is located between the middle conductive plate 20 and the lower conductive plate 18 and is electrically connected to both the middle conductive plate 20 and the lower conductive plate 18. Two or more first semiconductor chips 12 may be disposed between the upper conductive plate 16 and the middle conductive plate 20. In this case, the two or more first semiconductor chips 12 may be semiconductor chips of the same type (that is, having the same structure) or may be semiconductor chips of different types (that is, having different structures) from each other. Similarly, two or more same type or different types of second semiconductor chips 14 may be disposed between the middle conductive plate 20 and the lower conductive plate 18.

The upper conductive plate 16, the middle conductive plate 20, and the lower conductive plate 18 are each a plate-like member having conductivity, and at least a part thereof is constituted of a conductor. Although this is merely an example, each of the conductive plates 16, 18, 20 in the present embodiment is a metal plate and is constituted of copper. The upper conductive plate 16 is electrically connected to the first main electrode 12b of the first semiconductor chip 12 via a first conductive spacer 13. The middle conductive plate 20 is electrically connected to the second main electrode 12c of the first semiconductor chip 12. Although not particularly limited, the upper conductive plate 16 and the first conductive spacer 13, the first conductive spacer 13 and the first main electrode 12b of the first semiconductor chip 12, and the second main electrode 12c of the first semiconductor chip 12 and the middle conductive plate 20 may respectively be joined to each other by joint layers 50, 52, 54 (such as solder layers) having conductivity.

The middle conductive plate 20 is electrically connected also to the first main electrode 14b of the second semiconductor chip 14 via a second conductive spacer 15. Further, the lower conductive plate 18 is electrically connected to the second main electrode 14c of the second semiconductor chip 14. Although not particularly limited, the middle conductive plate 20 and the second conductive spacer 15, the second conductive spacer 15 and the first main electrode 14b of the second semiconductor chip 14, and the second main electrode 14c of the second semiconductor chip 14 and the lower conductive plate 18 may respectively be joined to each other by joint layers 60, 62, 64 (such as solder layers) having conductivity.

The upper conductive plate 16 is exposed outside on the upper surface 30a of the encapsulant 30. Due to this, the upper conductive plate 16 not only constitutes a part of an electrical circuit of the semiconductor device 10, but also functions as a heat dissipating plate for dissipating heat from the semiconductor chips 12, 14 to outside. Similarly, the lower conductive plate 18 is exposed outside on the lower surface 30b of the encapsulant 30. As such, also the lower conductive plate 18 not only constitutes a part of the electrical circuit of the semiconductor device 10, but also functions as a heat dissipating plate for dissipating heat from the semiconductor chips 12, 14 to outside.

Figure 2:
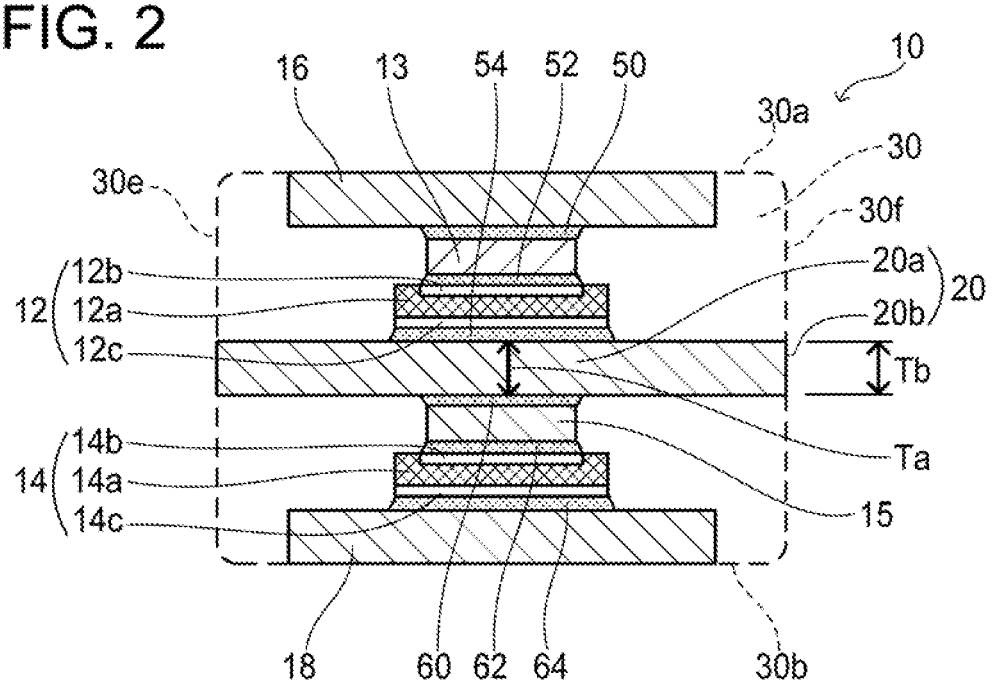
FIG. 2 shows a cross-sectional view along a line II-II of FIG. 1.
Figure 3:
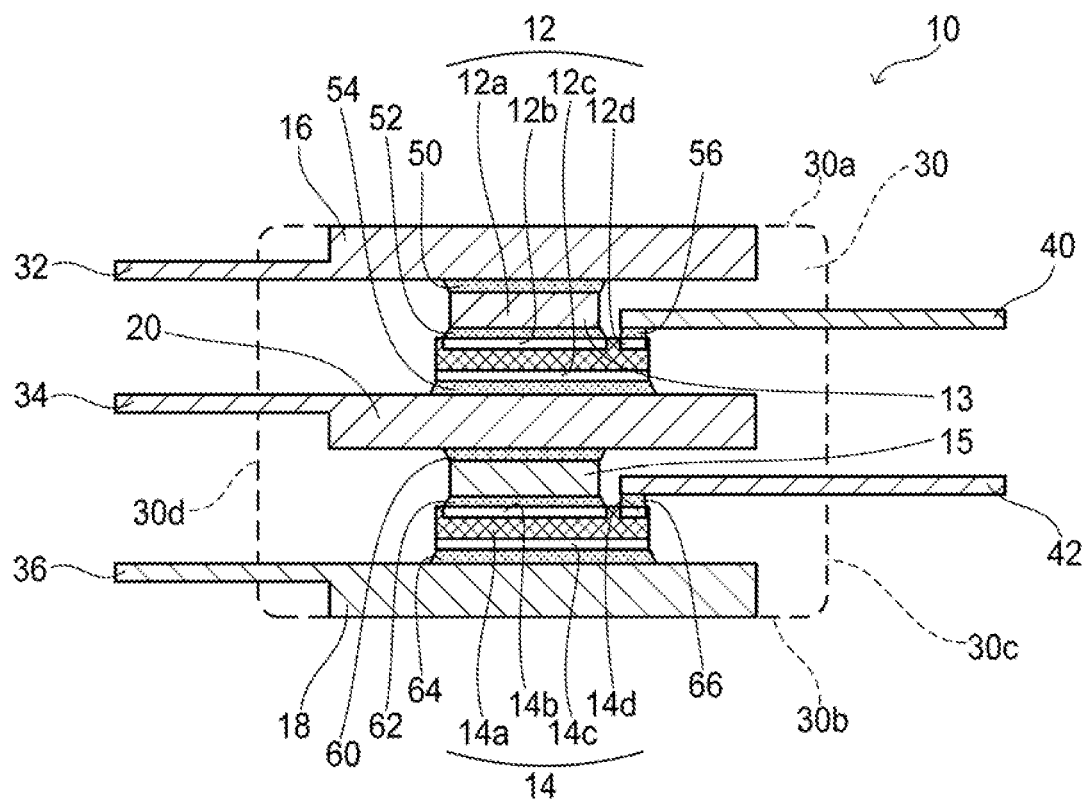
FIG. 3 shows a cross-sectional view along a line of FIG. 1.

In addition, in the semiconductor device 10 of the present embodiment, the middle conductive plate 20 is also exposed outside on the side surfaces 30e, 30f of the encapsulant 30, by which it can function as a heat dissipating plate. As shown in FIG. 2, the middle conductive plate 20 includes a main portion 20a joined to the first semiconductor chip 12 and the second semiconductor chip 14 within the encapsulant 30 and an exposed portion 20b exposed outside on the side surfaces 30e, 30f of the encapsulant 30. Further, a thickness Tb of the middle conductive plate 20 at the exposed portion 20b is equal to or greater than a thickness Ta of the middle conductive plate 20 at the main portion 20a.

The semiconductor device 10 includes a plurality of power terminals 32, 34, 36 and pluralities of signal terminals 40, 42. Although not particularly limited, these terminals 32, 34, 36, 40, 42 are constituted of metal such as copper. The plurality of power terminals 32, 34, 36 protrudes from the second end surface 30d of the encapsulant 30. The pluralities of signal terminals 40, 42 protrudes from the first end surface 30c of the encapsulant 30. However, specific structures such as positions and shapes of these terminals 32, 34, 36, 40, 42 are not particularly limited.

The plurality of power terminals 32, 34, 36 includes a first power terminal 32, a second power terminal 34, and a third power terminal 36. The first power terminal 32 is electrically connected to the upper conductive plate 16 within the encapsulant 30. Due to this, the first main electrode 12b of the first semiconductor chip 12 is electrically connected to the first power terminal 32 via the upper conductive plate 16. Although not particularly limited, the first power terminal 32 may be integrally configured with the upper conductive plate 16.

The second power terminal 34 is electrically connected to the middle conductive plate 20 within the encapsulant 30. Due to this, the second main electrode 12c of the first semiconductor chip 12 and the first main electrode 14b of the second semiconductor chip 14 are electrically connected to the second power terminal 34 via the middle conductive plate 20. Although not particularly limited, the second power terminal 34 may be integrally configured with the middle conductive plate 20. The third power terminal 36 is electrically connected to the lower conductive plate 18 within the encapsulant 30. Due to this, the second main electrode 14c of the second semiconductor chip 14 is electrically connected to the third power terminal 36 via the lower conductive plate 18. Although not particularly limited, the third power terminal 36 may be integrally configured with the lower conductive plate 18.

The pluralities of signal terminals 40, 42 include a plurality of first signal terminals 40 and a plurality of second signal terminals 42. The plurality of first signal terminals 40 is electrically connected to the plurality of signal electrodes 12d of the first semiconductor chip 12 respectively within the encapsulant 30. Although not particularly limited, the first signal terminals 40 and the signal electrodes 12d are joined in pairs to each other via joint layers 56 (such as a solder layer). Similarly, the plurality of second signal terminals 42 is electrically connected to the plurality of signal electrodes 14d of the second semiconductor chip 14 respectively within the encapsulant 30. Although not particularly limited, the second signal terminals 42 and the signal electrodes 14d are joined in pairs to each other via joint layers 66 (such as a solder layer).

According to the above configuration, the semiconductor device 10 of the present embodiment is incorporated into the power converter circuit such as a converter and an inverter, and can configure a switching circuit configured to flow and cut off current. When the current flows in the first semiconductor chip 12 and the second semiconductor chip 14, each of the first semiconductor chip 12 and the second semiconductor chip 14 generates heat. When the first semiconductor chip 12 and the second semiconductor chip 14 generate heat, temperatures of the three conductive plates 16, 18, 20 adjacent thereto rise accordingly, and thermal expansion occurs in each of the conductive plates 16, 18, 20. Especially, the middle conductive plate 20 located between the first semiconductor chip 12 and the second semiconductor chip 14 tends to become hotter than the upper conductive plate 16 and the lower conductive plate 18.

Due to this, in the semiconductor device 10 of the present embodiment, the middle conductive plate 20 is exposed outside on the side surfaces 30e, 30f of the encapsulant 30, and the heat from the middle conductive plate 20 can easily be dissipated outside. Due to this, a temperature rise in the middle conductive plate 20 is effectively suppressed. Especially, by arranging a cooler in contact with the exposed portion 20b of the middle conductive plate 20, the temperature rise in the middle conductive plate 20 is suppressed and both the first semiconductor chip 12 and the second semiconductor chip 14 can efficiently be cooled.

Figure 5:
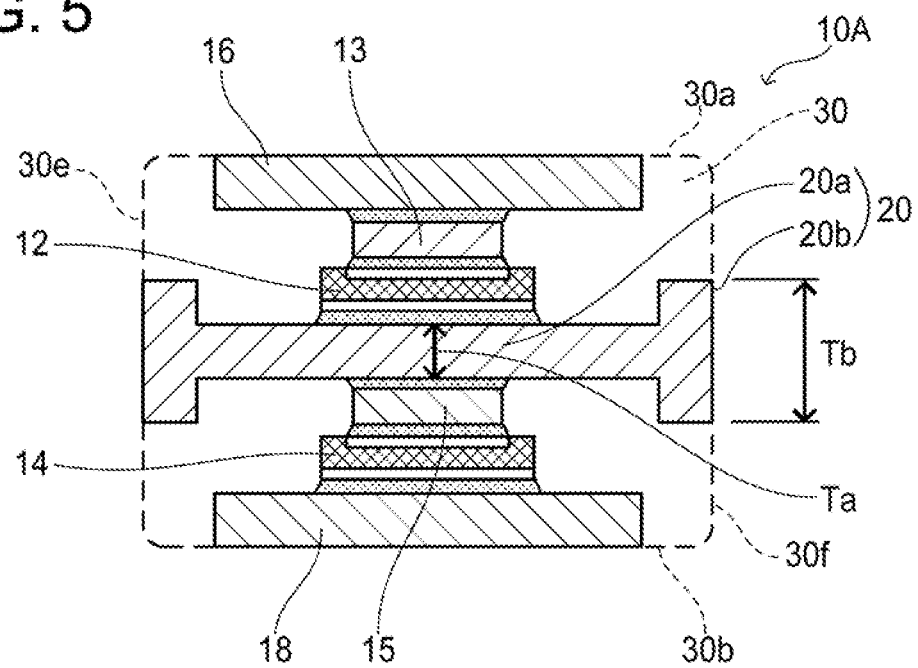
FIG. 5 is a cross-sectional view schematically showing a configuration of a semiconductor device 10A of a variant, and corresponds to the cross-sectional view shown in FIG. 2.

FIG. 5 shows a semiconductor device 10A of a variant. As shown in FIG. 5, a thickness Tb of a middle conductive plate 20 at an exposed portion 20b may be set sufficiently greater than a thickness Ta of the middle conductive plate 20 at a main portion 20a. In this case, the thickness Tb of the exposed portion 20b may be twice or more the thickness Ta of the main portion 20a. According to such a configuration, a temperature rise in the middle conductive plate 20 can further be suppressed. In addition, a shape of the middle conductive plate 20 may be symmetrical in a stacking direction of three conductive plates 16, 18, 20 (up-down direction in FIG. 5). According to such a configuration, a temperature difference between a first semiconductor chip 12 and a second semiconductor chip 14 can be decreased. The temperature rise in the middle conductive plate 20 can further be suppressed.

Figure 6:
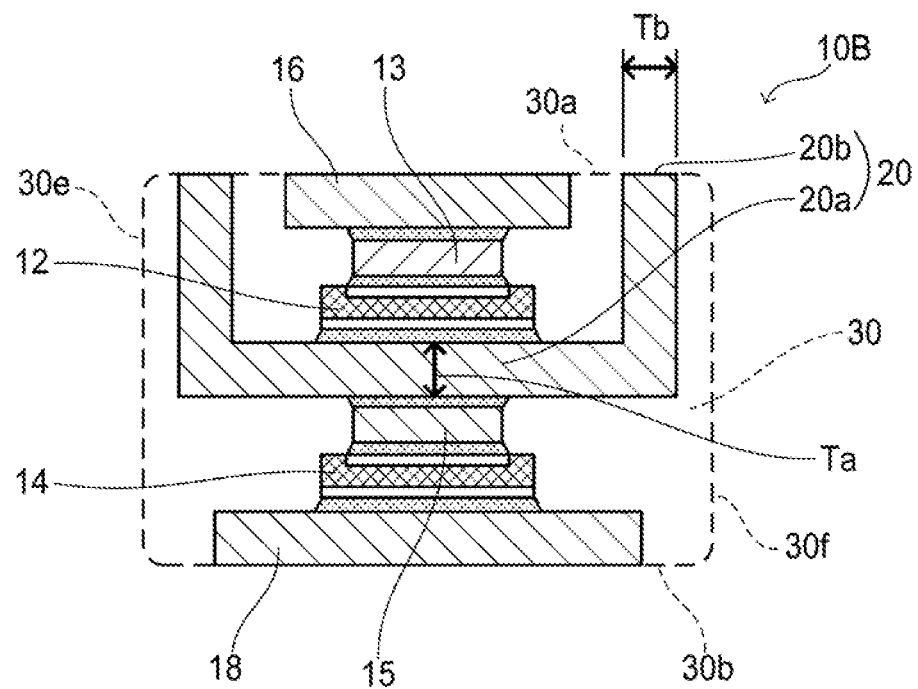
FIG. 6 is a cross-sectional view schematically showing a configuration of a semiconductor device 10B of a variant, and corresponds to the cross-sectional view shown in FIG. 2.

FIG. 6 shows a semiconductor device 10B of another variant. As shown in FIG. 6, an exposed portion 20b of a middle conductive plate 20 may be exposed outside on an upper surface 30a (or a lower surface 30b) of an encapsulant 30. That is, the exposed portion 20b of the middle conductive plate 20 may be exposed outside on a same surface of the encapsulant 30 as an upper conductive plate 16 or a lower conductive plate 18. According to such a configuration, the middle conductive plate 20 and one of the upper conductive plate 16 and the lower conductive plate 18 can simultaneously be cooled by arranging a cooler along the upper surface 30a or the lower surface 30b of the encapsulant 30.

Figure 7:
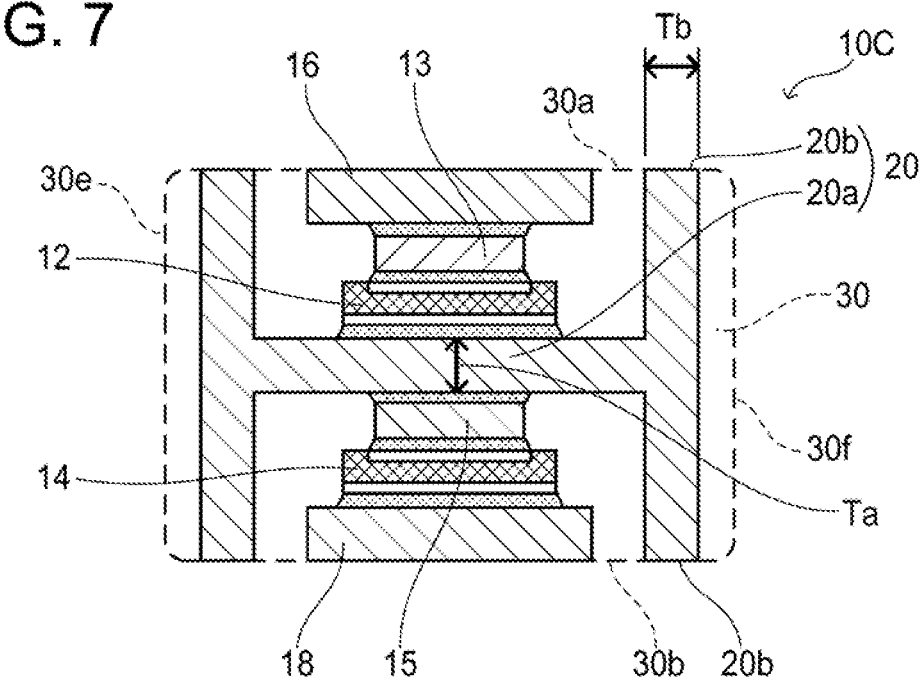
FIG. 7 is a cross-sectional view schematically showing a configuration of a semiconductor device 10C of a variant, and corresponds to the cross-sectional view shown in FIG. 2.

FIG. 7 shows a semiconductor device 10C of another variant. As shown in FIG. 7, an exposed portion 20b of a middle conductive plate 20 may be exposed outside on both an upper surface 30a and a lower surface 30b of an encapsulant 30. According to such a configuration, the middle conductive plate 20 can efficiently be cooled by two coolers by arranging each cooler adjacent to corresponding one of the upper surface 30a and the lower surface 30b of the encapsulant 30.

Figure 8:
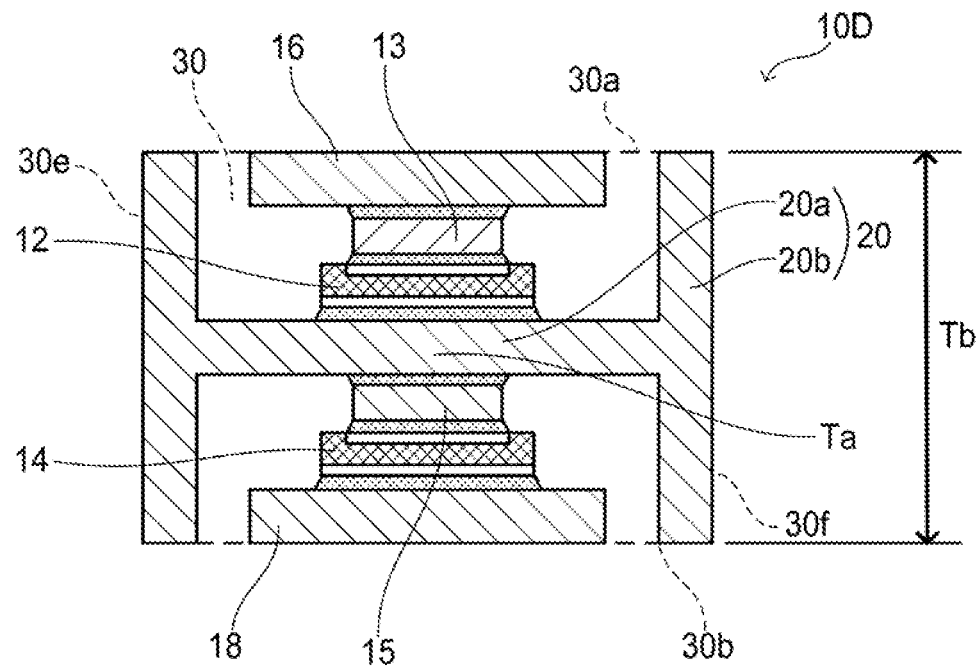
FIG. 8 is a cross-sectional view schematically showing a configuration of a semiconductor device 10D of a variant, and corresponds to the cross-sectional view shown in FIG. 2.

FIG. 8 shows a semiconductor device 10D of another variant. As shown in FIG. 8, an exposed portion 20b of a middle conductive plate 20 may be exposed outside on each of side surfaces 30e, 30f, an upper surface 30a, and a lower surface 30b of an encapsulant 30. According to such a configuration, due to the middle conductive plate 20 being exposed outside by broader areas, a greater quantity of heat from the middle conductive plate 20 can be dissipated outside.

Figure 9:
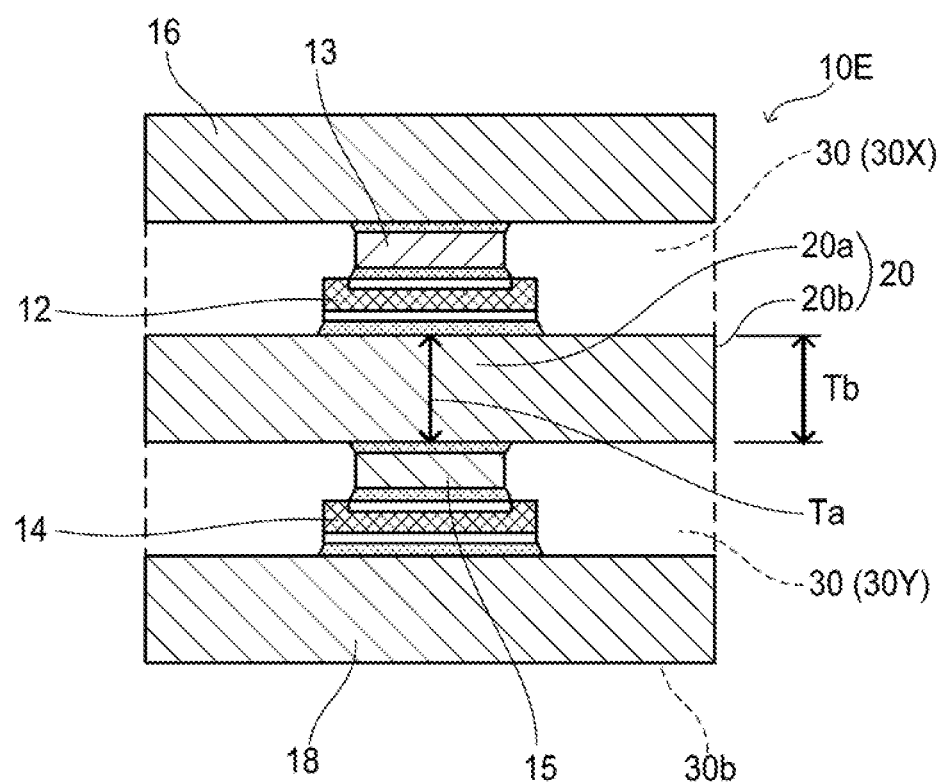
FIG. 9 is a cross-sectional view schematically showing a configuration of a semiconductor device 10E of a variant, and corresponds to the cross-sectional view shown in FIG. 2.

FIG. 9 shows a semiconductor device 10E of another variant. As shown in FIG. 9, an encapsulant 30 may be divided into a first encapsulant 30X and a second encapsulant 30Y by a middle conductive plate 20. The first encapsulant 30X is filled between an upper conductive plate 16 and the middle conductive plate 20 and encapsulates a first semiconductor chip 12. The second encapsulant 30Y is filled between the middle conductive plate 20 and a lower conductive plate 18 and encapsulates a second semiconductor chip 14. In this semiconductor device 10E as well, the middle conductive plate 20 includes a main portion 20a joined to the first semiconductor chip 12 and the second semiconductor chip 14 within the encapsulant 30 and an exposed portion 20b exposed outside on a surface of the encapsulant 30. Further, a thickness Tb of the exposed portion 20b of the middle conductive plate 20 is equal to or greater than a thickness Ta of the main portion 20a of the middle conductive plate 20.

What is claimed is:

1. A semiconductor device comprising:
   an upper conductive plate, a middle conductive plate, and a lower conductive plate which are stacked on each other;
   a first semiconductor chip located between the upper conductive plate and the middle conductive plate and electrically connected to both the upper conductive plate and the middle conductive plate;
   a second semiconductor chip located between the middle conductive plate and the lower conductive plate and electrically connected to both the middle conductive plate and the lower conductive plate; and
   an encapsulant encapsulating the first semiconductor chip and the second semiconductor chip and integrally holding the upper conductive plate, the middle conductor plate, and the lower conductive plate,
   wherein
   the middle conductive plate comprises a main portion joined to the first semiconductor chip and the second semiconductor chip within the encapsulant and an exposed portion exposed outside on a surface of the encapsulant, and
   a thickness of the exposed portion of the middle conductive plate is equal to or greater than a thickness of the main portion of the middle conductive plate.

2. The semiconductor device according to claim 1, wherein
   the thickness of the exposed portion of the middle conductive plate is greater than the thickness of the main portion of the middle conductive plate.

3. The semiconductor device according to claim 1, wherein
   the encapsulant comprises an upper surface and a lower surface located opposite the upper surface,
   the upper conductive plate is exposed outside the upper surface of the encapsulant, and
   the lower conductive plate is exposed outside the lower surface of the encapsulant.

4. The semiconductor device according to claim 3, wherein
   the encapsulant further comprises a side surface extending between the upper surface and the lower surface, and
   the exposed portion of the middle conductive plate is exposed outside the side surface of the encapsulant.

5. The semiconductor device according to claim 3, wherein
   the exposed portion of the middle conductive plate is exposed outside at least one of the upper surface and the lower surface of the encapsulant.

6. The semiconductor device according to claim 3, wherein
   the encapsulant further comprises a side surface extending between the upper surface and the lower surface, and
   the exposed portion of the middle conductive plate is exposed outside the side surface and further outside at least one of the upper surface and the lower surface of the encapsulant.

* * * * *